(12) United States Patent
Bialek (10) Patent No.: US 10,177,680 B2
(45) Date of Patent: Jan. 8, 2019

(54) ELECTRICAL SERVICE INTERFACE SYSTEM

(71) Applicant: San Diego Gas & Electric Company, San Diego, CA (US)

(72) Inventor: Thomas Owen Bialek, San Diego, CA (US)

(73) Assignee: San Diego Gas & Electric Company, San Diego, CA (US)

( * ) Notice: Subject to any disclaimer, the term of this patent is extended or adjusted under 35 U.S.C. 154(b) by 0 days.

(21) Appl. No.: 15/629,595

(22) Filed: Jun. 21, 2017

(65) Prior Publication Data

US 2017/0288570 A1     Oct. 5, 2017

Related U.S. Application Data

(63) Continuation of application No. 14/887,247, filed on Oct. 19, 2015, now Pat. No. 9,723,743.

(51) Int. Cl.
| | |
|---|---|
| *G06F 1/16* | (2006.01) |
| *H05K 5/00* | (2006.01) |
| *H05K 7/00* | (2006.01) |
| *H02M 7/42* | (2006.01) |
| *H05K 5/02* | (2006.01) |
| *H05K 7/02* | (2006.01) |
| *H01M 2/10* | (2006.01) |
| *H05K 7/14* | (2006.01) |

(52) U.S. Cl.
CPC ........... *H02M 7/42* (2013.01); *H01M 2/1072* (2013.01); *H05K 5/0217* (2013.01); *H05K 5/0247* (2013.01); *H05K 7/02* (2013.01); *H05K 7/1432* (2013.01); *H01M 2220/10* (2013.01)

(58) Field of Classification Search
CPC .. H05K 5/0217; H05K 5/0247; H05K 5/0234; H05K 7/02; H05K 7/14; H05K 7/1401; H05K 7/1438; H05K 7/18; H05K 7/183; H05K 7/186; H05K 5/0221; H05K 7/1474; H02M 7/42
USPC .................. 361/601–603, 679.32, 724–727; 312/223.1–223.3
See application file for complete search history.

(56) References Cited

U.S. PATENT DOCUMENTS

| | | |
|---|---|---|
| 4,772,999 A | 9/1988 | Fiorina et al. |
| 4,994,940 A | 2/1991 | Thouvenin et al. |
| 5,563,493 A | 10/1996 | Matsuda et al. |

(Continued)

OTHER PUBLICATIONS

Patent Cooperation Treaty, International Search Report for PCT/US2016/055349, Jan. 26, 2017, pp. 1-2.

*Primary Examiner* — Anthony Haughton
(74) *Attorney, Agent, or Firm* — Sheppard Mullin Richter & Hampton LLP (57) ABSTRACT

An electrical service interface system include a configurable device and inverter mounted to an equipment tower, wherein each of the configurable device and inverter include alignment devices configured to rollably mount the configurable device and inverter to corresponding guides mounted to a support pad, and to align the configurable device to the inverter, and the inverter to the equipment tower. In an installed configuration, the configurable device electrically and mechanically couples to the inverter via a DC connector and one or more mounting systems, and the inverter mechanically and electrically couples to the equipment tower via an AC connector and one or more mounting systems.

7 Claims, 5 Drawing Sheets

(56) References Cited

U.S. PATENT DOCUMENTS

| | | | |
|---|---|---|---|
| 5,748,464 A | 5/1998 | Schuetz | |
| 7,304,852 B2 | 12/2007 | Hernandez et al. | |
| 7,388,348 B2 | 6/2008 | Mattichak | |
| 7,511,451 B2 | 3/2009 | Pierce | |
| 7,724,503 B2 * | 5/2010 | Talja | H05K 7/1432 312/223.2 |
| 8,681,479 B2 | 3/2014 | Englert et al. | |
| 2004/0029617 A1 * | 2/2004 | Flynn | H05K 7/186 455/561 |
| 2007/0115616 A1 | 5/2007 | Vackar | |
| 2014/0104759 A1 * | 4/2014 | Takano | H05K 7/1432 361/637 |
| 2014/0146486 A1 | 5/2014 | Hammond | |
| 2014/0160686 A1 * | 6/2014 | Benson | H02M 7/003 361/724 |
| 2014/0192455 A1 | 7/2014 | Yoshida et al. | |

\* cited by examiner

ELECTRICAL SERVICE INTERFACE SYSTEM

RELATED APPLICATIONS

This application is a continuation-in-part of U.S. patent application Ser. No. 14/887,247 filed Oct. 19, 2015, the content of which is incorporated herein by reference in its entirety.

TECHNICAL FIELD

The disclosed technology relates generally to electrical interface systems. More specifically, the present disclosure is directed towards a mechanically integrated inverter and configurable device.

BACKGROUND

The incorporation of DC-to-AC inverters in power grids has become more prevalent with the increasing popularity of renewable energy sources, such as solar energy, to supplement power from the power grid. Moreover, energy storage devices have also been incorporated onto the power grid, generally near both the load and the inverter. For example, some residential or business consumers of electricity have added solar panels and an inverter to supplement or displace their use of power from the power grid, and have further added energy storage devices, such as batteries, to store excess energy for use when solar power is not available (i.e., at night).

Implementing systems with both inverters and energy storage devices, however, has created challenges for power companies and consumers. For example, these systems are often electrically incompatible with older electric systems or require extensive and costly installation modifications. As a result, the integration of new electric systems onto existing electric grids often results in voltage problems and intermittent power production and distribution.

Furthermore, in some cases, the integration of new electric systems into the existing power grid require the addition of new structures to support the new system. For example, a separate pad mount may be required for each of the inverter and energy storage device. This results in costly installation fees and complex system connections that may result in the disruption of power to nearby residences and business if easement or connections are improper or faulty.

BRIEF SUMMARY OF EMBODIMENTS

Embodiments of the disclosed technology are directed towards a pad mounted electrical service interface system. In particular, some embodiments of the disclosed technology are directed towards integrating an inverter and configurable device onto an existing electrical system. As disclosed herein, an example electrical service interface system may include a plurality of rails mounted on a top surface of a support pad and abutted against an equipment tower mounted on the same support pad.

In some embodiments, the electrical service interface system includes a configurable device, an inverter, and a set of alignment devices. In other embodiments, the set of alignment devices includes guide wheels rotatably mounted to and extending outward from a bottom side of the inverter, where the guide wheels are disposed within a longitudinal groove of the guides. In other embodiments, the set of alignment devices includes guide wheels rotatably mounted to and extending outward from a bottom side of the configurable device, where the guide wheels are disposed within a longitudinal groove of the guides. In other embodiments, the guide wheels are configured to roll longitudinally along the guides, such that the inverter and configurable device rollably mount to the support pad.

In one embodiment, an electrical service interface system comprises: (i) a plurality of guides mounted on a support pad, and oriented with respect to and abutted against an equipment tower, the equipment tower also being mounted on the support pad; (ii) a configurable device comprising an enclosure; and (iii) a first set of alignment devices mounted to and extending outward from a bottom side of the first enclosure, each of the first set of alignment devices being disposed within a longitudinal groove in a first of the plurality of guides; (iv) wherein each guide wheel is configured to roll longitudinally along one of the plurality of guide rails, such that the first enclosure and second enclosure rollably mount to the support pad. Such a system may further comprise: (i) a second set of alignment devices rotatably mounted to and extending outward from the bottom side of the first enclosure, each of the second set of alignment devices being disposed within a longitudinal groove in a second of the plurality of guides; (ii) a third set of alignment devices rotatably mounted to and extending outward from a bottom side of the second enclosure, each of the third set of alignment devices being disposed within a longitudinal groove in the first of the plurality of guides; (iii) a fourth set of alignment devices rotatably mounted to and extending outward from the bottom side of the second enclosure, each of the fourth set of alignment devices being disposed within a longitudinal groove in the second of the plurality of guides; and (iv) a configurable system disposed within the enclosure.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the disclosed technology to the precise form disclosed. It should be understood that the disclosed technology can be practiced with modification and alteration, and that the disclosed technology be limited only by the claims and the equivalents thereof.

DETAILED DESCRIPTION OF THE EMBODIMENTS

The following description is non-limiting and is made merely for the purpose of describing the general principles of the disclosed embodiments. Numerous specific details are set forth to provide a full understanding of various aspects of the subject disclosure. It will be apparent, however, to one ordinarily skilled in the art that various aspects of the subject disclosure may be practiced without some of these specific details. In other instances, well-known structures and techniques have not been shown in detail to avoid unnecessarily obscuring the subject disclosure.

Some embodiments of the disclosure provide an electrical service interface system. As disclosed herein, an electrical interface system may include an assembly to integrate an inverter and a fixed duration energy storage device fitted onto an electrical service interface system so that the completed assembly may consist of one box when a lid covers the fitted assembly. In some embodiments, the electrical service interface system may be integrated onto a support pad and an equipment tower. By way of example, the equipment tower may include an already existing and installed pad-mount transformer. A pad-mount transformer is a ground mounted electric power distribution transformer that may provide the final voltage transformation in the electric power distribution. The transformer may also be mounted on a shelf (i.e., directly mounted on the service panel), or other support structure, as known in the art. The final voltage transformation may result in stepping down the voltage in the selected distribution lines to the appropriate level for consumer use.

In some embodiments, the system may further include a set of guides mounted on the support pad to help guide and mount the inverter and configurable device to the equipment tower.

In some embodiments, the inverter and configurable device may include alignment devices mounted to and extending outward from a bottom side of the inverter and configurable device respectively. By way of example only, the alignment devices may be utilized to help align and position the inverter onto the support pad and properly attach the inverter onto the equipment tower. By way of another example, the alignment devices may be utilized to align and position the configurable device onto the support pad and attach the configurable device to the inverter. The alignment device may include, without limitation, wheels, roller chains, internal ring gear, and linear slides.

Figure 1:
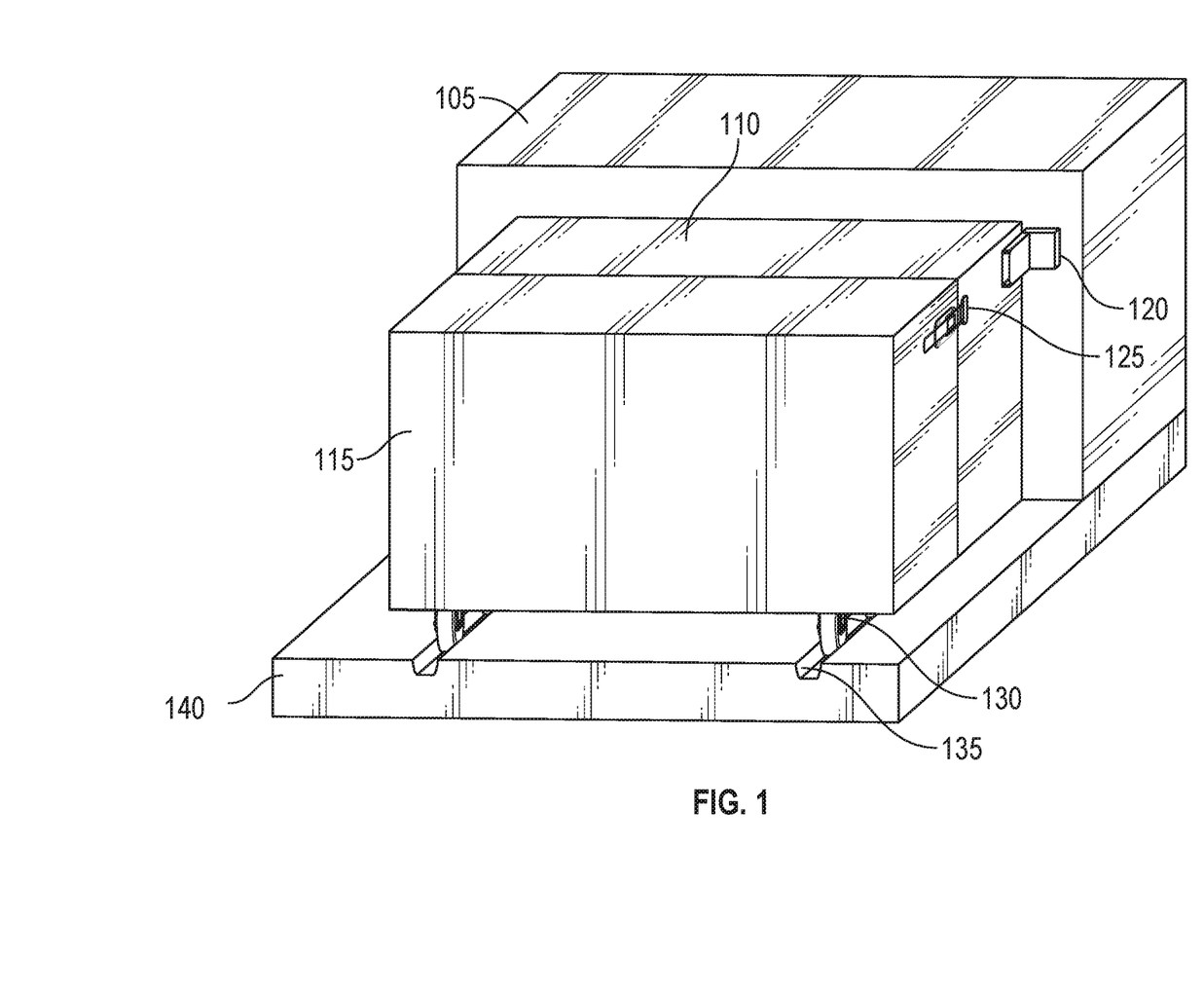
FIG. 1 illustrates a perspective view of an electrical service interface system with a configurable device and inverter assembly, consistent with embodiments disclosed herein.

In some embodiments, the inverter may be securely attached to and abutted against the equipment tower using a mounting system such as a latching mechanism. The inverter may also be securely attached and abutted against a configurable device using a mounting system. In other embodiments, the inverter may be securely attached to the equipment tower on one side of the inverter and securely attached to the configurable device on the other side of the inverter. Referring to FIG. 1, examples of latching mechanisms 120 and 125 may include, without limitation, a deadbolt latch, a spring latch, a boxlatch, a latchbolt, a paddle latch, a rotary latch, a deadlocking latchbolt, a drawbolt, a drawbolt with padlock loop, a padlock look, a slam latch, a cam latch, a Norfolk latch, a Suffolk latch, a crossbar, a compression latch, a draw latch, a rotary latch, a barrel bolt lock, a turn lock, a screws, bolt, or a barrel nut.

By way of example only, the integrated inverter and configurable device assembly may also function, or incorporate components that function as a dynamic and reactive power source when electrical connections are established. Furthermore, when integrated inverter and configurable assemblies are deployed as a fleet or network, power and electricity may be provided to residences and businesses, as well as collected and stored from other residence or business on the power grid. In some examples, the disclosed technology may provide power and electricity during power outages, thus providing flexible voltage and electrical power solutions. As such, the disclosed technology provides a flexible solution for voltage regulation issues for electrical service interface systems.

FIG. 1 illustrates a perspective view of an electrical service interface system. As illustrated, electrical service interface system 100 includes configurable device 115 and inverter 110. Electrical service interface system 100 may be mounted on a support pad 140, and an equipment tower 105 may also be mounted on the support pad. Equipment tower 105 may be used to service or couple to underground distribution networks to serve urban and rural residences or commercial and industrial energy loads.

As further illustrated, the electrical service interface system 100 includes a plurality of guide rails 135 mounted on a top surface of support pad 140. The plurality of guide rails 135 enables alignment of inverter 100 and configurable device 115 to each other, as well as to equipment tower 105.

Inverter 110 may include a set of alignment devices disposed on a bottom side of the inverter 110. In some embodiments, the alignment device may include guide wheels 130 rotatably mounted to and extending outward from the bottom side of the inverter 110. In other embodiments, the guide wheels 130 may be disposed within a longitudinal groove of the guide rails 135 on the support pad 140. In other embodiments, the alignment device may include roller chains, internal ring gear, linear slides, or other alignment devices as known in the art.

Configurable device 115 may also be configured with a set of alignment devices disposed on a bottom side of the energy storage device 110. Similar to the alignment devices described above with respect to the inverter, the alignment device 115 may include guide wheels 130 rotatably mounted to and extending outward from the bottom side of the configurable device 115. In other embodiments, the alignment device may include roller chains, internal ring gear, linear slides, or other alignment devices as known in the art.

As further illustrated in FIG. 1, latch mechanisms 120 and 125 may be used to securely place the inverter 110 and configurable device 115 onto the support 140 and attached to the equipment tower 105. In some embodiments, the inverter 110 may be coupled to the equipment tower 105 by a latch mechanism 120. In other embodiments, the inverter 110 may be coupled to a configurable device 115 by a latch mechanism 125. By way of example only, the inverter 110 may be coupled to the equipment tower 105 on one side of the inverter 110 and may be coupled to a configurable device 115 on the other side of the inverter 110. A lid may attach onto the equipment tower 105 so that the fitted assembly with a lid cover results in a single box housing.

Figure 2:
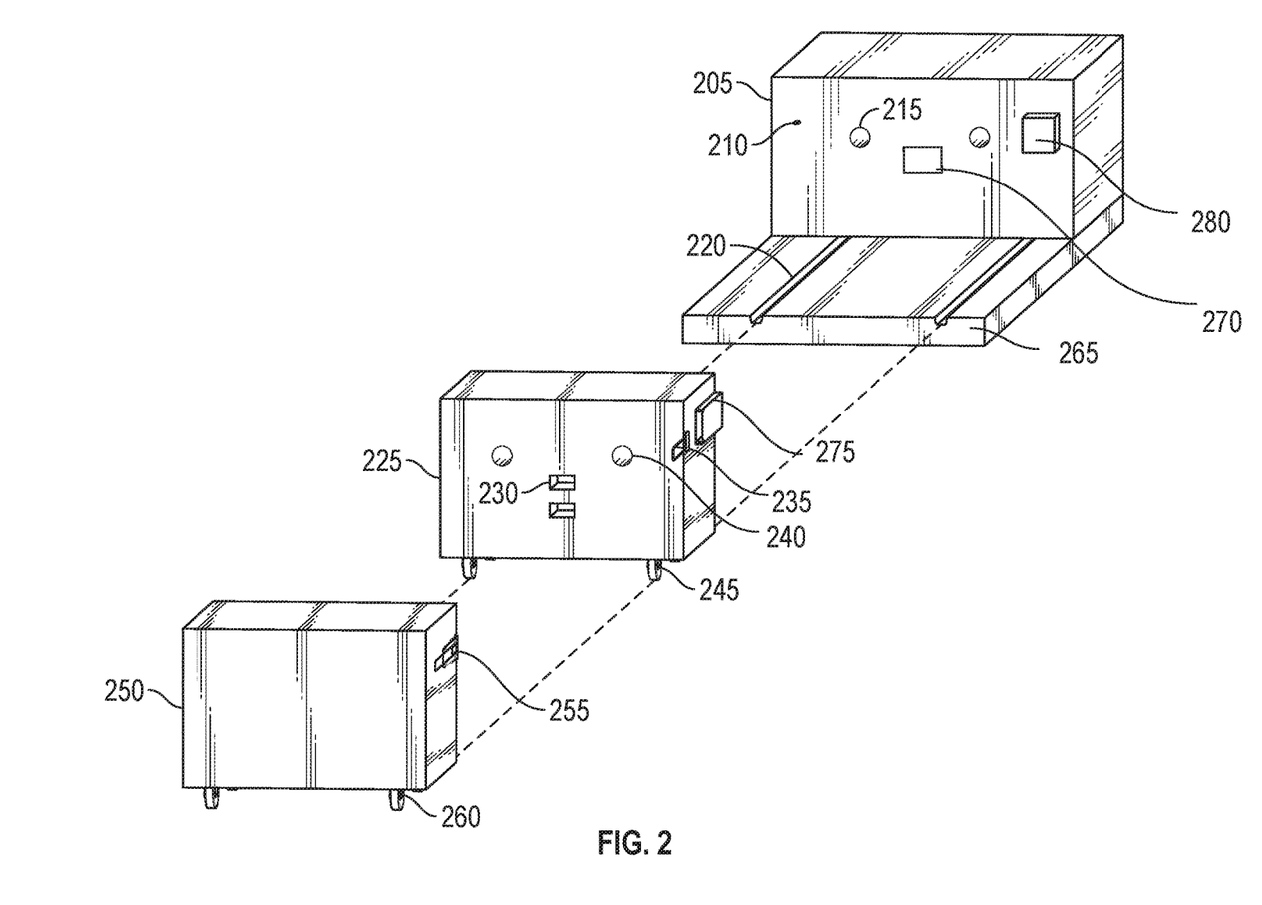
FIG. 2 illustrates components of an electrical service interface system with a configurable device and inverter, consistent with embodiments disclosed herein.

FIG. 2 illustrates components of an electrical service interface system, including configurable device 250 and inverter 225. As illustrated, the system may be mounted on a support pad 265 and may be orthogonally oriented with respect to and abutted against an equipment tower 205. In some embodiments, a guide rail 220 is installed on support pad 265 to assist in positioning and aligning inverter 225 and configurable device 250 on support pad 265. In an installed configuration, configurable device 250 abuts against inverter 225, and inverter 225 abuts against equipment tower 205. As illustrated, each of configurable device 250 and inverter 225 include enclosures. For example, each enclosure may be a rectangular prism shape, with a front side, a back side, a top side, a bottom side, and two opposing edge sides. As described herein, whenever reference is made to mounting systems or latches, guide wheels, or alignment pins to either the configurable device or inverter, one of ordinary skill in the art would understand that such mounting systems or latches, etc. is made with respect to one of the sides of the corresponding enclosure.

As further illustrated in FIG. 2, the inverter 225 includes a plurality of guide wheels 245, attached to a bottom side of inverter 225 (i.e., the bottom side of the inverter enclosure), enabling inverter 225 to be rollably mounted onto support pad 265 so that the inverter 225 may abut against the equipment tower 205. In other embodiments, the inverter 225 is abutted against the equipment tower 205 to establish an electrical connection with the equipment tower 205. In some embodiments, the back side of the inverter 225 includes an AC connector configured to electrically couple to the AC connector 270 on the equipment tower 205. For example, the AC connector on the back side of the inverter 225 may be a male AC connector bus configured to create an electrical connection to the corresponding female AC connector 270 attached to the side of the equipment tower 205.

In some embodiments, configurable device 250 includes a plurality of guide wheels 260 that enable the configurable device 250 to rollably mount to support pad 265 enabling configurable device 250 to abut against inverter 225. In other embodiments, the configurable device 250 may be abutted against the inverter 225 to establish an electrical connection between the inverter 225 and equipment tower 205. In some embodiments, a back side of the configurable device 260 includes a DC connector configured to electrically couple to the DC connector 230 on the inverter 225. For example, the DC connector on the back side of the configurable device 250 may be a male DC connector configured to create an electrical connection to the corresponding female DC connector 240 attached to the inverter 225.

Alignment pins may also be utilized to align the inverter to both the configurable device and the equipment tower. In one embodiment, an alignment pin is located on a back side of the inverter 225, the alignment pin being configured to insert into an alignment receptacle 215 located on the equipment tower 205. By inserting the alignment pin of the inverter 225 into the alignment receptacle 215, the inverter is properly positioned relative to the equipment tower 205.

In some embodiments, an alignment pin is also located on a back side of the configurable device 250, the alignment pin being configured to insert into an alignment receptacle 240 located on the front side of the inverter 225. By inserting the alignment pin of the configurable device 250 into the alignment receptacle 240 of the inverter, the configurable device 250 is properly positioned relative to the inverter 225.

Configurable device 250 may also be securely attached to the inverter 225 via a latch 255 that couples to a notch 235 on the inverter 225. Inverter 225 may also include a latch mechanism 275 that couples to a notch 280 on the equipment tower 205 to ensure that the inverter 225 is securely attached to equipment tower 205. In some embodiments, pairs of latching mechanisms may be used (i.e., a latching mechanism may be mounted on either side of both the inverter and configurable device). Accordingly, the inverter 225 may be secured to the configurable device 250 and the equipment tower 205 using the latching mechanisms.

Figure 3:
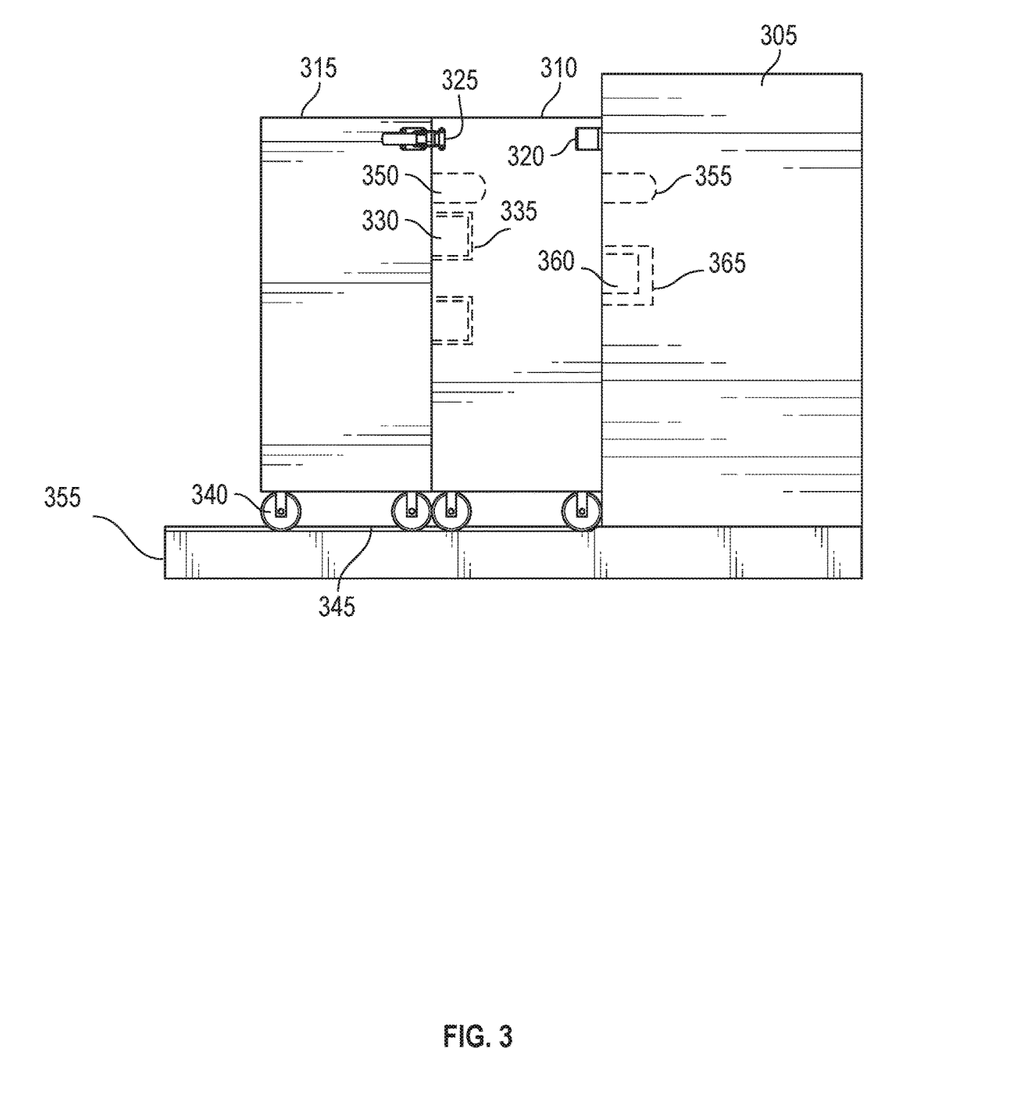
FIG. 3 illustrates a cross-section side view of an electrical service interface system with a configurable device and an inverter assembly attached to the equipment tower, consistent with embodiments disclosed herein.

FIG. 3 illustrates a cross-section side view of an electrical service interface system. As illustrated, electrical service interface system 300 includes inverter 310 and configurable device 315. The system may be mounted and electrically coupled to equipment tower 305. In some embodiments, the inverter 310 and configurable device 315 may be configured with a set of alignment devices disposed on the respective bottom surface of both inverter 310 and configurable device 315.

As illustrated, the system includes an inverter 310 configured to mechanically couple to an equipment tower 305. Inverter 310 may be configured to electrically couple with the equipment tower 305. Inverter 310 may include an AC connector 360 located on the back side of the inverter 310, the AC connector being configured to electrically couple to an AC connector 365 located on the front side of the equipment tower 305. In order to align inverter 310 with equipment tower 305, inverter 310 may include an alignment pin 355 that is configured to insert into an alignment receptacle 370 when the inverter 310 abuts to the equipment tower 305. In order to secure inverter 310 to equipment tower 305, inverter 310 may include a latch mechanism 320 configured to mechanically couple to a receiving notch on equipment tower 305.

In some embodiments, inverter 310 may be further configured to electrically couple to configurable device 315. Configurable device 315 may include a battery, a capacitor, or other means of storing electrical energy as known in the art. Inverter 310 may include a DC connector 335 located on the front side of inverter 310, the DC connector 335 being configured to couple to a DC connector 330 located on the back side of configurable device 315. In order to align configurable device 315 to inverter 310, inverter 310 may include an alignment pin receptacle 335 configured to receive an alignment pin 330 when configurable device 315 abuts to inverter 310. In order to secure inverter 310 to configurable device 315, configurable device 315 may include a latch mechanism 325 configured to mechanically couple to a receiving notch on inverter 310.

Figure 4:
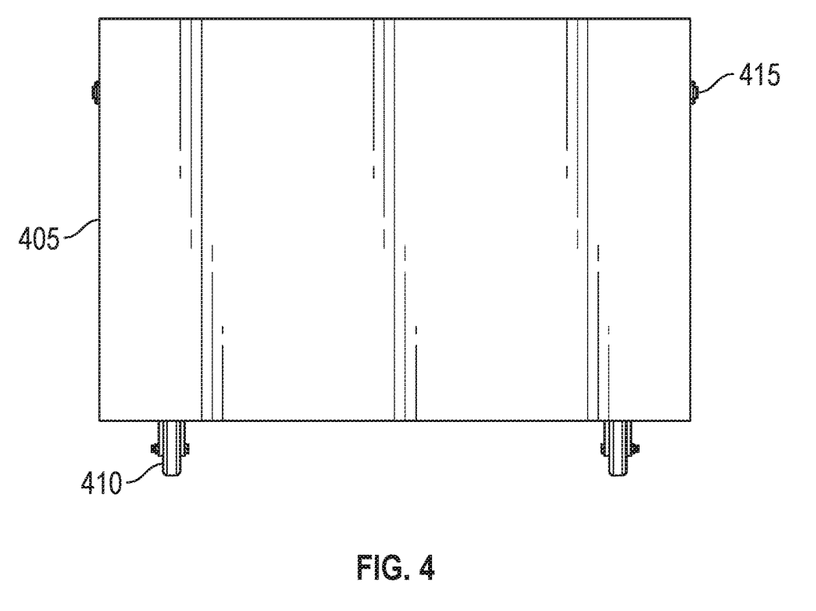
FIG. 4 illustrates a front view of a configurable device, consistent with embodiments disclosed herein.

FIG. 4 illustrates a front view component of a configurable device. For example, configurable device 405 may be a battery, a capacitor, a flywheel, a compressed air-energy storage, a thermal, solar, or pumped hydro power energy storage device, or other energy storage device as known in the art.

As illustrated, the configurable device may include guide wheels 410 rotatably mounted to configurable device 405, and configured to enable configurable device 405 to rollably mount to an inverter and an equipment tower via guides on a pad mount. Furthermore, configurable device 405 may include a latch mechanism 415 on one or both sides of the configurable device enclosure, as described above. In some embodiments, the electrical storage device 405 may utilize the latch 415 that couples to a notch on the inverter to secure the configurable device to the inverter.

Figure 5:
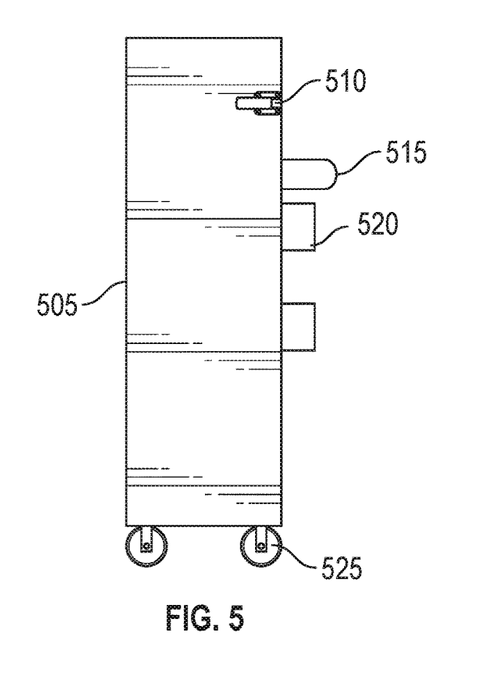
FIG. 5 illustrates a side view of a configurable device, consistent with embodiments disclosed herein

FIG. 5 illustrates a side view of a configurable device. As illustrated, configurable device 505 may include guide wheels 525. Latch 510 attached to the configurable device 505 may securely couple to a notch on a selected apparatus (i.e., the inverter). In other embodiments, the configurable device 505 may attach itself onto any other apparatus contained within the pad counted electrical system. The configurable device 505 may also include an alignment pin 515 configured to insert into an accommodating alignment receptacle.

Alternatively, configurable device 505 may couple directly or indirectly to the equipment tower. The configurable device 505 may include an inverter within the housing further eliminating the need for the configurable device 505 to be coupled to another apparatus containing an inverter. As such, the configurable device 505 with a self-contained inverter may result in a dynamic and reactive power source when the configurable device is coupled to the equipment tower. In such an embodiment, the configurable device 505 may include a AC connector to electrically couple to an AC connector on a service transformer (i.e., the equipment tower).

As further illustrated in FIG. 5, configurable device 505 may include a DC connector 520 that couples to an accommodating DC connector in a selected apparatus (i.e., the inverter). In some embodiments, DC connector 520 may be male and may be configured to insert into a female DC connector (e.g., using an interference fit, a friction fit, a snap-fit, a form-fit, or another coupling mechanism as known in the art).

Figure 6:
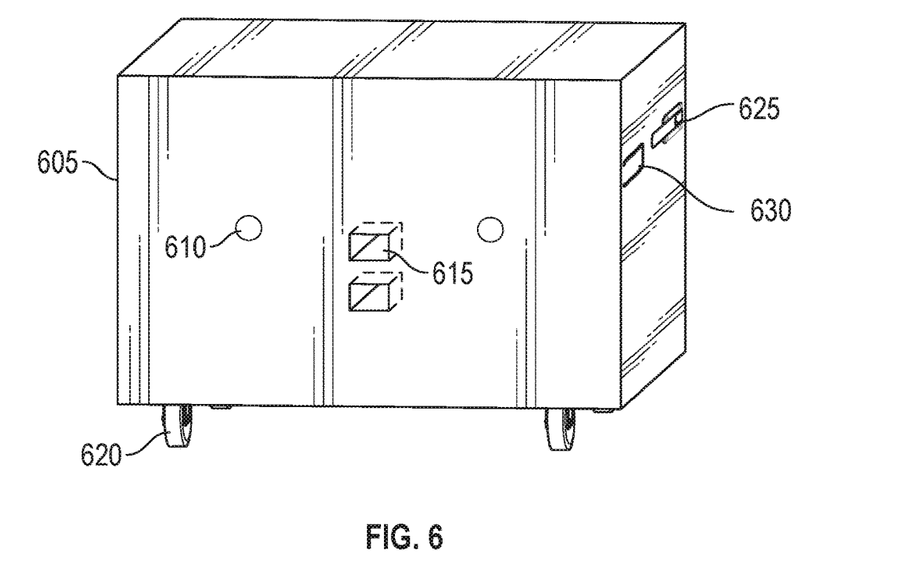
FIG. 6 illustrates a front view of an inverter, consistent with embodiments disclosed herein.

FIG. 6 illustrates a perspective view of an inverter. As illustrated, inverter 605 may include guide wheels 620 so that the inverter 605 may be rollably mounted onto a top surface of a support pad. Inverter 605 may also include one or more latches 625 to securely couple to a selected apparatus (i.e., the configurable device or equipment tower, or both). When inverter 605 is installed and attached to the equipment tower, as illustrated by FIG. 1, the inverter 605 and equipment tower may act as a reactive power source.

Inverter 605 may include one or more notches 630 enabling another apparatus (i.e., the configurable device) to securely couple (via latches) to the inverter 605. In some embodiments, the inverter 605 may include one or more alignment receptacles 610 configured to receive alignment pins mounted on the configurable device, to properly align the configurable device to the inverter 605.

Figure 7:
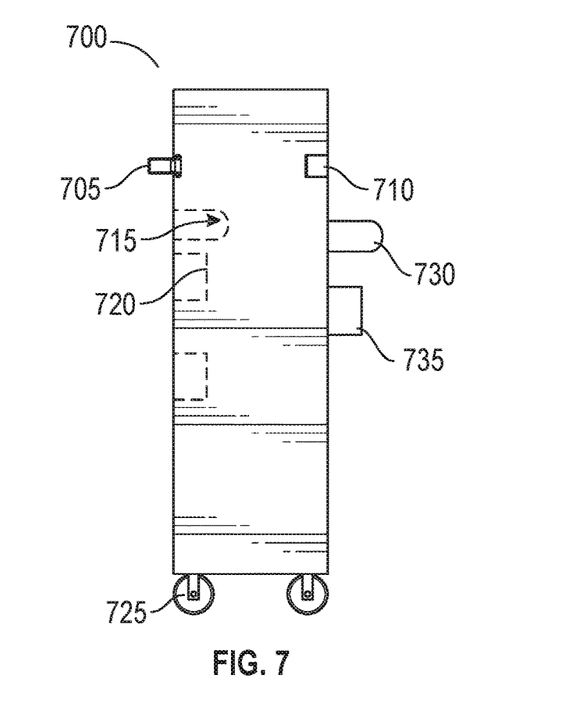
FIG. 7 illustrates a cross-section side view of an inverter, consistent with embodiments disclosed herein.

FIG. 7 illustrates a side cross-section view of an inverter. The inverter 700 may include guide wheels 725 rotatably mounted to a bottom surface of the inverter, such that inverter 700 may be rollably mounted and guided by guides (e.g., guide rails mounted on a support pad, as illustrated in FIGS. 1 and 2).

As illustrated in FIG. 7, inverter 700 may include DC connector 720. Inverter 700 may also be configured to include AC connector 735 (e.g., located on the back side of inverter 700). AC connector 735 may be configured to electrically couple to an AC connector on a service transformer (i.e., the equipment tower). To further aid the inverter in establishing a proper electrical connection with the AC connector, the inverter may be configured to include an alignment pin 730 located at the back side of the inverter 700. The inverter may further include an alignment pin receptacle 715 so that another device may be securely aligned next to the inverter 700.

As further illustrated in FIG. 7, inverter 700 may have a latching mechanism 705, 710 to ensure that the inverter 700 in properly and securely mounted on a service transformer.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An electrical service interface system comprising:
   a plurality of guides mounted on a support pad, and oriented with respect to and abutted against an equipment tower, the equipment tower also being mounted on the support pad;
   a configurable device comprising a first enclosure; and
   a first set of alignment devices mounted to and extending outward from a bottom side of the first enclosure, the first set of alignment devices being disposed within a longitudinal groove in a first of the plurality of guides;
   wherein the set of alignment devices comprises a first set of guide wheels rotatably mounted to and extending outward from a bottom side of the first enclosure, the first set of guide wheels being disposed within a longitudinal groove in a first of the plurality of guide rails, and a second set of guide wheels rotatably mounted to and extending outward from a bottom side of a second enclosure, the third set of guide wheels being disposed within a longitudinal groove in the first of the plurality of guide rails;
   wherein the first enclosure and second enclosure rollably mount to the support pad.

2. The system of claim 1, further comprising a second set of alignment devices rotatably mounted to and extending outward from the bottom side of the first enclosure, each of the second set of alignment devices being disposed within a longitudinal groove in a second of the plurality of guides.

3. The system of claim 2, further comprising a fourth set of alignment devices rotatably mounted to and extending outward from the bottom side of the second enclosure, each of the fourth set of alignment devices being disposed within a longitudinal groove in the second of the plurality of guides.

4. The system of claim 1, further comprising a configurable system disposed within the enclosure.

5. The system of claim 1, wherein the first enclosure further comprises a mounting system configured to mechanically couple to the equipment tower.

6. The system of claim 5, wherein the mounting system is located on the enclosure and couples to an equipment tower.

7. The system of claim 1, wherein the configurable device further comprises a connector accessible through an aperture located in a side of the enclosure to electrically couple to the equipment tower.

* * * * *